(12) United States Patent
Doi et al.

(10) Patent No.: US 10,005,101 B2
(45) Date of Patent: Jun. 26, 2018

(54) METHOD OF FORMING PNBZT FERROELECTRIC THIN FILM

(71) Applicant: MITSUBISHI MATERIALS CORPORATION, Tokyo (JP)

(72) Inventors: Toshihiro Doi, Naka-gun (JP); Hideaki Sakurai, Naka-gun (JP); Nobuyuki Soyama, Naka-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 350 days.

(21) Appl. No.: 14/181,542

(22) Filed: Feb. 14, 2014

(65) Prior Publication Data

US 2014/0295172 A1 Oct. 2, 2014

(30) Foreign Application Priority Data

Mar. 26, 2013 (JP) .................................. 2013-063179

(51) Int. Cl.
*H01L 49/02* (2006.01)
*B05D 3/02* (2006.01)
(Continued)

(52) U.S. Cl.
CPC ............. *B05D 3/0254* (2013.01); *B05D 1/38* (2013.01); *C23C 14/088* (2013.01);
(Continued)

(58) Field of Classification Search
None
See application file for complete search history.

(56) References Cited

U.S. PATENT DOCUMENTS 5,206,788 A * 4/1993 Larson .................... H01G 7/06
257/295
5,913,117 A * 6/1999 Lee ......................... H01L 21/02
257/E21.002
(Continued)

FOREIGN PATENT DOCUMENTS

CN 1929038 A 3/2007
EP 1760770 A2 3/2007
(Continued)

OTHER PUBLICATIONS

Pereira, Effect of Nb doping on the microstructural and electrical properties of the PZT ceramics, Journal of the European Ceramic Society 21 (2001) pp. 1353-1356. (Year: 2001).*
(Continued)

*Primary Examiner* — Monique Jackson
(74) *Attorney, Agent, or Firm* — Locke Lord LLP; James E. Armstrong, IV; Nicholas J. DiCeglie, Jr.

(57) ABSTRACT

A method includes: coating a composition for forming a PZT ferroelectric film not containing Nb on a lower electrode 11 formed on a substrate 10, prebaking the composition, and baking the composition to be crystallized and to thereby form a crystallization promoting layer 12 having a thickness 45 to 90 nm thereon; coating a composition for forming a PNbZT-based ferroelectric film, containing 4 to 10 at % of Nb in 100 at % of all the perovskite B site atoms (Zr, Ti) contained in the composition, on the formed crystallization promoting layer 12 to form a coating film 13a of PNbZT thereon; and pre-baking the coating film 13a and then baking the coating film 13a to be crystallized and to thereby form a PNbZT ferroelectric thin film on the lower electrode 11.

3 Claims, 3 Drawing Sheets

10 SUBSTRATE
11 LOWER ELECTRODE
12 CRYSTALLIZATION PROMOTING LAYER
13a COATING FILM (SOL FILM) OF PNbZT

(51) Int. Cl.
  *B05D 1/38* (2006.01)
  *H01L 21/02* (2006.01)
  *C23C 14/08* (2006.01)
  *C23C 14/58* (2006.01)
  *C23C 18/12* (2006.01)

(52) U.S. Cl.
  CPC ...... *C23C 14/5806* (2013.01); *C23C 18/1216* (2013.01); *C23C 18/1225* (2013.01); *C23C 18/1241* (2013.01); *C23C 18/1254* (2013.01); *H01L 21/022* (2013.01); *H01L 21/02197* (2013.01); *H01L 21/02282* (2013.01); *H01L 21/02304* (2013.01); *H01L 28/56* (2013.01); *Y10T 428/26* (2015.01)

(56) References Cited

U.S. PATENT DOCUMENTS

| | | | | |
|---|---|---|---|---|
| 2005/0185026 | A1* | 8/2005 | Noguchi | B41J 2/161 347/68 |
| 2007/0054038 | A1* | 3/2007 | Kijima | H01L 21/31691 427/126.1 |
| 2008/0111172 | A1* | 5/2008 | Wang | H01L 27/0629 257/295 |
| 2008/0225569 | A1* | 9/2008 | Nawano | H01G 4/085 365/145 |
| 2008/0231667 | A1* | 9/2008 | Arakawa | B41J 2/14233 347/71 |
| 2009/0246360 | A1 | 10/2009 | Hamada et al. | |
| 2012/0295099 | A1* | 11/2012 | Watanabe | H01L 21/02197 428/336 |

FOREIGN PATENT DOCUMENTS

| | | |
|---|---|---|
| JP | 2002-525876 A | 8/2002 |
| JP | 2005-072474 A | 3/2005 |
| JP | 2006-041425 A | 2/2006 |
| JP | 2006-120740 A | 5/2006 |
| JP | 2009-076571 A | 4/2009 |
| JP | 2009-252786 A | 10/2009 |
| JP | 2012-256850 A | 12/2012 |
| WO | WO-00/17936 A1 | 3/2000 |

OTHER PUBLICATIONS

Jian Zhong et al. "Effect of Nb Doping on Highly {100}-Textured PZT Films Grown on CSD-Prepared $PbTiO_3$ Seed Layers", Integrated Ferroelectrics, pp. 1-11 and cover pages.

European Search Report dated May 19, 2014, issued for the European patent application No. 14155334.7.

Notice of Reasons for Rejection, issued in corresponding Japanese Patent Application No. JP 2013-063179, dated Jul. 19, 2016.

Office Action (part of Search Report) issued in corresponding Chinese Patent Application No. CN 201410057519.3, dated Feb. 24, 2017.

Notice of Allowance, issued in corresponding European Patent Application No. EP 141553341, dated Apr. 18, 2017.

F. Qin et al. "PZNT epitaxy growth on STO substrates with and without PZT seed layer," Journal of Crystal Growth 275, Department of Physics, Shanghai Jiao Tong University, Shanghai, China (2005).

S. Iakovlev et al., "Dielectric and pyroelectric properties of PZFNT/PZT bimorph thin films," Institute for Materials and Surface Technology (IMST), Kiel. Germany, Journal of Materials Science: Materials in Electronics 14; 143-148, (2003).

Office Action (Part of Search Report) issued in corresponding Taiwanese Patent Application No. TW 103105197, dated Jan. 19, 2017.

Jian Zhong et al. "Effect of Nb Doping on Highly {100}-Textured PZT Films Grown on CSD-Prepared $PbTiO_3$ Seed Layers", Integrated Ferroelectrics, pp. 1-11 and cover pages. 2011.

* cited by examiner

10 SUBSTRATE
11 LOWER ELECTRODE
12 CRYSTALLIZATION PROMOTING LAYER
13a COATING FILM (SOL FILM) OF PNbZT

10 SUBSTRATE
11 LOWER ELECTRODE
12 CRYSTALLIZATION PROMOTING LAYER
13 PNbZT FERROELECTRIC THIN FILM

METHOD OF FORMING PNBZT FERROELECTRIC THIN FILM

BACKGROUND OF THE INVENTION

Field of the Invention

The present invention relates to a method of forming a PNbZT ferroelectric thin film. Specifically, the invention relates to a method of forming a PNbZT ferroelectric thin film, which is used for a dielectric layer or the like of a thin film capacitor, using a sol-gel method. More specifically, the invention relates to a method of forming a PNbZT ferroelectric thin film in which a PZT ferroelectric thin film is doped with a high concentration of Nb to significantly improve ferroelectric properties such as relative dielectric constant without being doped together (hereinafter, referred to as "co-doping") with silicon or the like.

Priority is claimed on Japanese Patent Application No. 2013-063179, filed on Mar. 26, 2013, the content of which is incorporated herein by reference.

Description of Related Art

When a PZT-based ferroelectric thin film formed of a perovskite type oxide such as lead zirconate titanate (hereinafter, referred to as "PZT") is formed using a chemical solution deposition (CSD) method such as a sol-gel method, a technique of doping a PZT-based ferroelectric film with a donor atom other than metal elements such as Pb, which are major components of the film, to improve ferroelectric properties such as relative dielectric constant is known in the related art (for example, refer to Jian Zhong et al. "Effect of Nb Doping on Highly {100}-Textured PZT Films Grown on CSD-Prepared PbTiO$_3$ Seed Layers", Integrated Ferroelectrics). Specifically, for example, among Pb atoms, Ti atoms, Zr atoms, and the like constituting a PZT-based ferroelectric thin film, a method of substituting a part of Pb atoms of A site with trivalent lanthanum or bismuth or a method of substituting a part of Ti atoms or Zr atoms of B site with pentavalent Nb (niobium) or W (tungsten) is used. For example, PLZT obtained by adding a small amount of lanthanum to PZT can be obtained using the above-described method. As a technique of the related art using the above-described method, for example, a capacitor in which a dielectric film represented by the formula Pb(Zr$_x$Ti$_y$M$_z$)O$_3$ (wherein M represents at least one selected from the group consisting of Nb, Ta and V, and x+y+z=1) is used as a dielectric layer; and a method of manufacturing the capacitor are disclosed (for example, refer to Japanese Unexamined Patent Application, First Publication No. 2005-72474 (claims 1 to 4, paragraphs [0008] and [1061])). That is, in the method disclosed in Japanese Unexamined Patent Application, First Publication No. 2005-72474, a ferroelectric film is formed by doping Nb atoms, Ta atoms, or V atoms.

SUMMARY OF THE INVENTION

Technical Problem

Meanwhile, similarly to the case of ceramic synthesis of the related art, the formation of a ferroelectric thin film using a sol-gel method is performed through a thermal equilibrium process such as baking. When a thermal equilibrium process is performed, a large amount of atoms having different valences are added to maintain the neutrality of charges in a compound. In this case, there is a problem in that a heterogeneous phase is precipitated, and a single-phase desired compound cannot be obtained. Therefore, for example, when a PZT-based ferroelectric thin film is doped with pentavalent Nb during the formation of a ferroelectric thin film using a sol-gel method, there is a limit for the doping amount. In order to solve the problems and increase the doping amount, in the related art, a method of co-doping an accepter atom and silicon is used for ceramic synthesis. As disclosed in Japanese Unexamined Patent Application, First Publication No. 2005-72474, a method of mixing a sintering additive such as silicon is also used for the formation of a ferroelectric thin film using a sol-gel method. However, when such Si atoms or the like are co-doped, ferroelectric properties such as relative dielectric constant cannot be sufficiently exhibited. In addition, in "Effect of Nb Doping on Highly {100}-Textured PZT Films Grown on CSD-Prepared PbTiO$_3$ Seed Layers", a ferroelectric thin film which is formed by doping Nb having a relatively high concentration of 4 at % is disclosed. However, the ferroelectric thin film to which 4 at % of Nb is added has a lower dielectric constant and a lower piezoelectric constant than those of a ferroelectric thin film to which 3 at % of Nb is added, and substantially no effects are obtained by doping a high concentration of Nb. The reason is presumed to be that, even when raw materials are doped with a high concentration of Nb to form a film in a thermal equilibrium process, Nb is not sufficiently incorporated into PZT of the formed thin film. That is, in "Effect of Nb Doping on Highly {100}-Textured PZT Films Grown on CSD-Prepared PbTiO$_3$ Seed Layers", a technique of improving the properties of a ferroelectric thin film by doping a high concentration of Nb is not disclosed.

An object of the invention is to provide a method of forming a PNbZT ferroelectric thin film in which a PZT ferroelectric thin film can be doped with a high concentration of Nb to significantly improve ferroelectric properties such as relative dielectric constant without being co-doped with silicon or the like.

Solution to Problem

According to a first aspect of the invention, there is provided a method of forming a niobium-doped lead zirconate titanate (PNbZT) ferroelectric thin film, the method including: coating a composition for forming a ferroelectric thin film, which is formed of a lead zirconate titanate (PZT)-based composite perovskite film not containing Nb, on a lower electrode formed on a substrate, pre-baking the composition, and baking the composition to be crystallized and to thereby form a crystallization promoting layer having a thickness of 45 to 90 nm on the lower electrode; coating a composition for forming a ferroelectric thin film, which is formed of a PNbZT-based composite perovskite film containing 4 to 10 at % of Nb in 100 at % of all the B site atoms (Zr, Ti), on the formed crystallization promoting layer to form a coating film of PNbZT on the crystallization promoting layer; and pre-baking the coating film and then baking the coating film to be crystallized and to thereby form a PNbZT ferroelectric thin film on the lower electrode.

According to a second aspect of the invention, there is provided a complex electronic component including: a PNbZT ferroelectric thin film which is formed using the method according to the first aspect, in which the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

Advantageous Effects of Invention

In the method of forming a PNbZT ferroelectric thin film according to the first aspect, before coating the composition for forming a PNbZT ferroelectric thin film, the ferroelectric thin film, which is formed of a lead zirconate titanate (PZT)-based composite perovskite film not containing Nb, is formed as the crystallization promoting layer on the lower electrode formed on the substrate at a predetermined thickness. As a result, unlike the related art, Nb can be doped without co-doping Si atoms or the like, and further a high concentration of Nb can be doped. Accordingly, a PNbZT ferroelectric thin film in which ferroelectric properties such as relative dielectric constant are significantly improved can be formed. In addition, leakage current can be reduced.

The thin film capacitor or the like according to the second aspect includes, as a dielectric layer or the like, a PNbZT ferroelectric thin film which is formed using the above-described method according to the invention and has extremely superior ferroelectric properties such as relative dielectric constant, and thus the electrical properties and the service life reliability are superior.

DETAILED DESCRIPTION OF THE INVENTION

Next, embodiments of the invention will be described based on the drawings.

Figure 1:
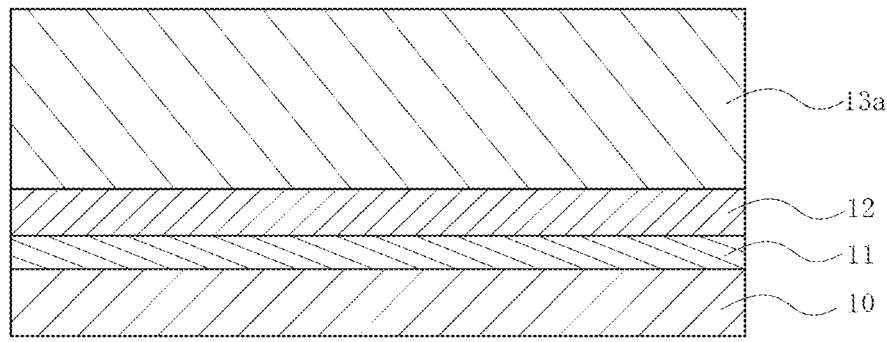
FIG. 1 is a cross-sectional view schematically illustrating one process of a method or forming a PNbZT ferroelectric thin film according to an embodiment of the invention.
Figure 2:
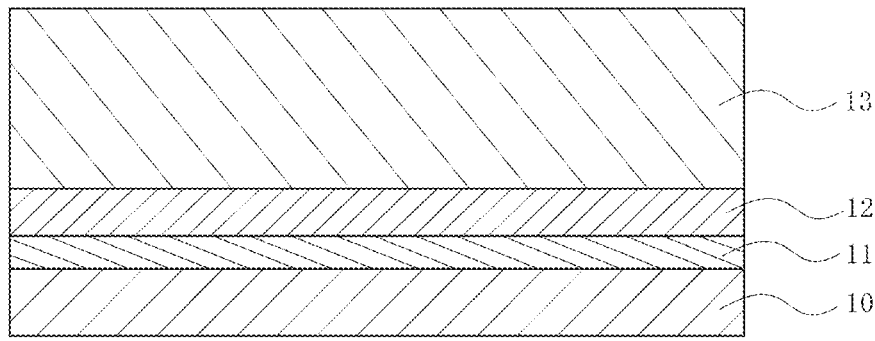
FIG. 2 is a cross-sectional view schematically illustrating a PNbZT ferroelectric thin film which is formed using the method according to the embodiment of the invention.

This embodiment relates to a method of forming a PZT-based ferroelectric thin film used for, for example, a dielectric layer of a thin film capacitor or the like, particularly, to a method of forming a PNbZT ferroelectric thin film in which a PZT ferroelectric thin film is doped with Nb as a donor atom. In the method according to the embodiment, as illustrated in FIGS. 1 and 2, before coating a composition for forming a PNbZT ferroelectric thin film 13, a ferroelectric thin film (hereinafter, referred to as "PZT ferroelectric thin film"), which is formed of a lead zirconate titanate (PZT)-based composite perovskite film not containing Nb, is formed as a crystallization promoting layer 12 on a lower electrode 11 formed on a substrate 10 at a predetermined thickness.

The composition used for forming the crystallization promoting layer 12, that is, for forming the PZT ferroelectric thin film contains a PZT precursor as a raw material for forming a composite metal oxide having a perovskite structure in the formed ferroelectric thin film such that a desired metal atomic ratio is obtained. Specifically, when the PZT precursor is represented by the formula "$Pb_y Zr_{1-x} Ti_x O_3$", it is preferable that the metal atomic ratio be adjusted such that x and y satisfy $0.4 \leq x \leq 0.6$ and $1.0 \leq y \leq 1.25$, respectively. In addition, for example, PLaZT obtained by adding La to PZT or PMnZT obtained by adding Mn to PZT may be formed as the crystallization promoting layer 12.

As a material of the PZT precursor, a compound in which an organic group binds to a metal element such as Pb, La, Zr, or Ti through an oxygen or nitrogen atom of the organic group is preferable. Examples of such a compound include one or two or more elements selected from the group consisting of metal alkoxides, metal diol complexes, metal triol complexes, metal carboxylates, metal β-diketonate complexes, metal β-diketoester complexes, metal β-iminoketo complexes, and metal amino complexes. Particularly preferable compounds are metal alkoxides, and partial hydrolysates and organic acid salts thereof.

Specifically, examples of a Pb compound and a La compound include acetates such as lead acetate: $Pb(OAc)_2$ or lanthanum acetate: $La(OAc)_3$; and alkoxides such as lead diisopropoxide: $Pb(OiPr)_2$ or lanthanum triisopropoxide: $La(OiPr)_3$. Examples of a Ti compound include alkoxides such as titanium tetraethoxide: $Ti(OEt)_4$, titanium tetraisopropoxide: $Ti(OiPr)_4$, titanium tetra n-butoxide: $Ti(OiBu)_4$, titanium tetraisobutoxide: $Ti(OiBu)_4$, titanium tetra t-butoxide: $Ti(OtBu)_4$, or titanium dimethoxy diisopropoxide: $Ti(OMe)_2(OiPr)_2$. As a Zr compound, the similar alkoxides as those of the Ti compound are preferable. Metal alkoxides may be used without any change, but partial hydrolysates thereof may be used in order to promote decomposition. In addition, examples of a Mn compound include manganese acetate, manganese 2-ethylhexanoate, and manganese naphthenate.

In order to prepare the composition, these materials are dissolved in an appropriate solvent at a concentration suitable for coating. As the solvent, carboxylic acids, alcohols (for example, ethanol, 1-butanol, or polyols other than diol), esters, ketones (such as acetone or methyl ethyl ketone), ethers such as dimethylether or diethylether), cycloalkanes (such as cyclohexane or cyclohexanol), aromatic compounds (such as benzene, toluene, or xylene) or tetrahydrofuran; or mixed solvents of two or more of the above-described solvents can be used. Among these, from the viewpoints of an evaporation rate and solubility, 1-butanol, ethanol, or propylene glycol is particularly preferable.

Preferable examples of carboxylic acids include n-butyric acid, α-methylbutyric acid, i-valeric acid, 2-ethylbutyric acid, 2,2-dimethylbutyric acid, 3,3-dimethylbutyric acid, 2,3-dimethylbutyric acid, 3-methylpentanoic acid, 4-methylpentanoic acid, 2-ethylpentanoic acid, 3-ethylpentanoic acid, 2,2-dimethylpentanoic acid, 3,3-dimethylpentanoic acid, 2,3-dimethylpentanoic acid, 2-ethylhexanoic acid, and 3-ethylhexanoic acid.

In addition, preferable examples of esters include ethyl acetate, propyl acetate, n-butyl acetate, sec-butyl acetate, tert-butyl acetate, isobutyl acetate, n-amyl acetate, sec-amyl acetate, tert-amyl acetate, and isoamyl acetate. Preferable examples of alcohols include 1-propanol, 2-propanol, 1-butanol, 2-butanol, isobutyl alcohol, 1-pentanol, 2-pentanol, 2-methyl-2-pentanol, and 2-methoxyethanol.

The ratio of the PZT precursor to 100 wt % of the composition is preferably in a range of 5 wt % of the 30 wt % in terms of oxides. When the ratio is lower than the lower limit, it is difficult to form a film having a sufficient thickness, and productivity may deteriorate. On the other hand, when the ratio is higher than the upper limit, the viscosity is increased, and it is difficult to perform uniform coating. The ratio of the PZT precursor is more preferably 10 to 25 wt % in terms of oxides. The ratio in terms of oxides refers to the ratio of metal oxides to 100 wt % of the composition which is calculated under the assumption that all the metal elements contained in the composition are converted into the metal oxides.

In addition, a stabilizer may be optionally added to the composition at a ratio (number of molecules of stabilizer)/ (number of metal atoms) of about 0.2 to 3. Examples of the stabilizer include β-diketones (such as acetyl acetone, heptafluorobutanoyl pivaloyl methane, dipivaloyl methane, trifluoroacetyl acetone, or benzoyl acetone), β-ketonic acids (such as acetoacetic acid, propionyl acetic acid, or benzoyl acetic acid), β-keto esters (such as methyl, propyl, butyl, and other lower alkyl esters of the above-described ketonic acids), oxy acids (such as lactic acid, glycolic acid, α-oxybutyric acid, or salicylic acid), lower alkyl esters of the above-described oxy acids, oxyketones (such as diacetone alcohol or acetoin), diols, triols, higher carboxylic acids, alkanol amines (such as diethanolamine, triethanolamine, or monoethanolamine), and polyvalent amines. Among these, acetyl acetone of β-diketones is preferable as the stabilizer.

In order to prepare the composition, first, the above-described Pb compound and the like of the PZT precursor are prepared and weighed at ratios for obtaining the desired metal atomic ratio, respectively. The weighed PZT precursor and a solvent are poured into a reaction vessel, followed by reflux and reaction, preferably, in a nitrogen atmosphere at a temperature of 130 to 170° C. for 0.5 to 5 hours. As a result, a synthetic solution is prepared. After reflux, it is preferable that a solvent be removed using a method such as atmospheric distillation or distillation under reduced pressure. In addition, when a stabilizer such as acetyl acetone is added, it is preferable that the stabilizer be added to the synthetic solution during the pouring of the PZT precursor, followed by reflux in a nitrogen atmosphere at a temperature of 130 to 170° C. for 0.5 to 5 hours.

By being left to stand at room temperature after reflux, the synthetic solution is cooled to a temperature preferably in a range from room temperature to 40° C. Next, another solvent such as butanol is added to the synthetic solution, followed by stirring to dilute the synthetic solution. As a result, the ratio of the PZT precursor to 100 wt % of the prepared composition is adjusted to be 10 to 25 wt % in terms of oxides.

After the preparation of the composition, it is preferable that particles be removed from the composition by filtration or the like such that the number of particles having a particle size of 0.5 μm or greater (preferably 0.3 μm or greater and more preferably 0.2 μm or greater) be less than or equal to 50 particles/mL per 1 mL of the composition. When the number of particles having a particle size of 0.5 μm or greater in the composition is more than 50 particle/mL, long-term storage stability deteriorates. The fewer number of particles having a particle size of 0.5 μm or greater in the composition, the better. In particular, the number of particles is preferably less than or equal to 30 particles/mL.

A method of treating the prepared composition such that the number of particles is in the above-described range is not particularly limited. For example, the following method may be used. A first method is a filtration method of supplying pressure with a syringe using a commercially available membrane filter having a pore size of 0.2 μm. A second method is a pressure filtration method in which a commercially available membrane filter having a pore size of 0.05 μm is combined with a pressure tank. A third method is a circulation filtration method in which the filter used in the second method is combined with a solution circulating tank.

In all the methods, a particle capture rate by the filter varies depending on a supply pressure of the composition. It is generally known that, the lower the pressure, the higher the capture rate. Particularly in the first method or the second method, in order to realize the condition that the number of particles having a particle size of 0.5 μm or greater is less than or equal to 50 particles per 1 mL of the composition, it is preferable that the composition be made to pass extremely slowly through the filter at a low pressure. Preferable examples of a commercially available composition for forming the crystallization promoting layer prepared as above include PZT-E1 (manufactured by Mitsubishi Material Corporation).

In addition to the PZT precursor, the composition used for forming the PZT ferroelectric thin film may contain 35 wt % of propylene glycol, 14 wt % of acetylacetone, and 35 wt % of butanol. In addition, the composition used for forming the PZT ferroelectric thin film may further contain ethanol, 2-propanol, or 1-ocatanol.

The crystallization promoting layer 12 is formed at a thickness of 45 to 90 nm using a so-called sol-gel method including: coating the composition on the lower electrode 11 to form a coating film (sol film); prebaking the coating film; and baking the coating film to be crystallized. The coating method is not particularly limited, and examples thereof include spin coating, dip coating, liquid source misted chemical deposition (LSMCD), and electrostatic spray coating.

As the substrate 10, different substrates are used according to the uses thereof. For example, when a dielectric layer of a thin film capacitor or the like is formed using the method according to the embodiment, a heat-resistant substrate, such as a silicon substrate or a sapphire substrate, on which a lower electrode is formed is used. The lower electrode which is formed on the substrate is formed of a material, such as Pt, Ir, or Ru, which has conductivity and is not reactive with the PZT ferroelectric thin film. In addition, for example, a substrate on which a lower electrode is formed with an adhesion layer, an insulating film, and the like interposed therebetween can be used. Specific examples of the substrate include substrates having a laminate structure (lower electrode/adhesion layer/insulating film/substrate) of Pt/Ti/SiO$_2$/Si, Pt/TiO$_2$/SiO$_2$/Si, Pt/IrO/Ir/SiO$_2$/Si, Pt/TiN/SiO$_2$/Si, Pt/Ta/SiO$_2$/Si, or Pt/Ir/SiO$_2$/Si. On the other hand, in a piezoelectric element, a pyroelectric infrared detecting element, or the like, a heat-resistant substrate such as a silicon substrate, a SiO$_2$/Si substrate, or a sapphire substrate can be used.

The lower electrode 11 can be formed using a vapor growth method such as a sputtering method or a vacuum deposition method or using a sol-gel method of coating an electrode paste using a screen printing method, a spray method, or a liquid droplet ejecting method to form a lower electrode. In the method according to the embodiment, it is preferable that crystals of the lower electrode be preferentially oriented [111] or [100] in a direction perpendicular to a surface on which the composition is coated. As a result, the crystallization promoting layer is easily formed.

After the coating film is formed on the lower electrode 11, this coating film is pre-baked and then baked to be crystallized. Pre-baking is performed using a hot plate or rapid thermal annealing (RTA) under a predetermined condition. It is preferable that pre-baking be performed in the air, in an oxygen atmosphere or in a water vapor-containing atmosphere in order to remove a solvent and to thermally decompose or hydrolyze a metal compound to be transformed into a complex oxide. Even during heating in the air, moisture required for hydrolysis is sufficiently secured with moisture in the air. In addition, the coating process of the composition to the pre-baking process can be repeated multiple times until a film having a predetermined thickness is obtained, and, finally, baking can be performed in a batch process. In addition, during pre-baking, it is preferable that the temperature be 285 to 315° C.; and that the holding time at the temperature be 1 to 5 hours.

Baking is the process for baking the pre-baked coating film at a crystallization temperature or higher to be crystallized. As a result, a crystallization promoting layer which is formed of a PZT ferroelectric thin film not containing Nb is obtained. As a baking atmosphere in this crystallization process, $O_2$, $N_2$, Ar, $N_2O$, $H_2$, or a mixed gas thereof is preferable. Baking is performed at 600 to 700° C. for 0.5 to 5 minutes. Baking may be performed by rapid thermal annealing (RTA). When baking is performed by RTA, a temperature increase rate thereof is preferably 10 to 50° C./sec.

Through the above-described processes, the crystallization promoting layer 12 is formed on the lower electrode 11. The reason for limiting the thickness of the crystallization promoting layer to be in the above-described range is as follows. When the thickness of the crystallization promoting layer is less than the lower limit, an island-shaped film is formed and does not sufficiently function as a layer for promoting the crystallization. On the other hand, when the thickness of the crystallization promoting layer is greater than the upper limit, the amount of Nb contained in the finally obtained PNbZT ferroelectric thin film (described below) is reduced. Therefore, an effect of improving ferroelectric properties such as relative dielectric constant cannot be obtained. The thickness of the crystallization promoting layer can be adjusted by the coating amount of the composition (the thickness of the gel film).

In addition, it is preferable that the crystallization promoting layer be formed such that [100] of crystals thereof is preferentially oriented in the thickness direction of the layer. During crystallization to [100], the crystallization speed is high. Therefore, when the crystallization promoting layer is formed to be preferentially oriented to [100], the PNbZT ferroelectric thin film formed on the crystallization promoting layer is also preferentially oriented to [100], and thus the crystallization speed during baking is increased. The crystallization during baking progresses under kinetic control. Therefore, when the crystallization speed during baking is increased, a high concentration of Nb is likely to be incorporated into crystals of the formed PNbZT ferroelectric thin film. In order to obtain the crystallization promoting layer of which crystal planes are preferentially oriented to [100], it is preferable that the coating amount of the composition be adjusted such that the thickness of the crystallization promoting layer is in the above-described range of 45 to 90 nm, preferably, 60 to 75 nm; and that a substrate including a Pt lower electrode preferentially oriented to [111] be used.

After forming the crystallization promoting layer 12 using the above-described method, a composition for forming a ferroelectric thin film (hereinafter, referred to as PNbZT ferroelectric thin film), which is formed of a niobium-doped lead zirconate titanate (PNbZT)-based composite perovskite film, is coated on the crystallization promoting layer 12 to form a coating film of PNbZT (gel film) 13a. The coating method is not particularly limited, and the same methods as the above-described for forming the crystallization promoting layer, such as a spin coating method, can be used.

The composition for forming the PNbZT ferroelectric thin film is obtained by doping the composition for forming the above-described PZT ferroelectric thin film with Nb and, during preparation, can be prepared using the same materials and the same method as the PZT ferroelectric thin film, except that a Nb compound is added during the pouring of the Zr compound and the Ti compound, in addition to the Pb compound, the Zr compound, and the Ti compound. That is, with the method of forming a PNbZT ferroelectric thin film according to the invention, a PNbZT ferroelectric thin film can be formed by doping a high concentration of Nb without adding a sintering additive such as silicon, which is required in the related art, to the composition for forming the PNbZT ferroelectric thin film. Therefore, the effects obtained by Nb doping can be sufficiently obtained, and ferroelectric properties such as relative dielectric constant can be significantly improved. The ratio of the PZT precursor and the Nb compound to 100 wt % of the composition is preferably in a range of 10 to 25 wt % in terms of oxides. When the ratio is lower than the lower limit, productivity may deteriorate. On the other hand, when the ratio is higher than the upper limit, it is difficult to perform uniform coating.

Similarly to the case of the above-described PZT precursor, as the Nb compound, a compound, such as metal alkoxides, in which an organic group binds to Nb through an oxygen or nitrogen atom of the organic group is preferable. Specific examples of such a compound include niobium pentaethoxide and niobium 2-ethylhexanoate.

The Nb compound is added to the composition at a ratio in which 4 to 10 at % of Nb is contained in 100 at % of all the B site atoms (Zr, Ti) contained hi the composition. In this way, with the method according to the embodiment, a large amount of Nb can be doped to form a PNbZT ferroelectric thin film as compared to the related art. The technical ground on which a large amount of Nb can be doped to form a PNbZT ferroelectric thin film by forming the predetermined crystallization promoting layer in advance is presumed to be as follows. For example, by introducing the above-described ferroelectric thin film having crystals preferentially oriented to [100] which have substantially the same lattice constant as the crystallization promoting layer, crystal growth progresses under kinetic control, and Nb atoms are likely to be uniformly solid-solved. When the ratio of Nb is lower than the lower limit, the above-described effects cannot be obtained by the addition of Nb. On the other hand, when the ratio of Nb is higher than the upper limit, cracking occurs in a film. It is preferable that the Nb compound be added to the composition at a ratio in which 6 to 8 at % of Nb is contained in 100 at % of all the B site atoms (Zr, Ti) contained in the composition. "B site atoms" refers to Zr and Ti among Pb, Zr, and Ti. Preferable examples of a commercially available composition for forming the PNbZT ferroelectric thin film prepared as above include PNbZT-E1 (manufactured by Mitsubishi Material Corporation).

After the coating film 13a of PNbZT is formed, this coating film is pre-baked and then baked to be crystallized. Pre-baking is performed using a hot plate or rapid thermal annealing (RTA) under a predetermined condition. Similarly to the case of the above-described formation of the crystallization promoting layer, it is preferable that pre-baking be performed in the air, in an oxygen atmosphere or in a water vapor-containing atmosphere. Before pre-baking, particularly in order to remove a low-boiling-point solvent or adsorbed water molecules, a low-temperature heat treatment may be performed using a hot plate at a temperature of 70 to 90° C. for 0.5 to 5 minutes.

For the purpose of sufficiently removing a solvent and the like to further enhance the effect of suppressing cracks or promoting the densification of a film structure, it is preferable that two-stage pre-baking be performed while changing a heating holding temperature. When one-stage prebaking is performed, it is preferable that the temperature be 275 to 325° C.; and that the holding time at the temperature be 3 to 10 minutes. In addition, the coating process of the composition to the pre-baking process can be repeated multiple times until a film having a predetermined thickness is obtained, and, finally, baking can be performed in a batch process.

Baking is the process for baking the pre-baked coating film of PNbZT at a crystallization temperature or higher to be crystallized. As a baking atmosphere in this crystallization process, $O_2$, $N_2$, Ar, $N_2O$, $H_2$, or a mixed gas thereof is preferable. Baking is performed at 600 to 700° C. for 0.5 to 5 minutes. Baking may be performed by rapid thermal annealing (RTA). When baking is performed by RTA, a temperature increase rate thereof is preferably 10 to 50° C./sec.

Through the above-described processes, a PNbZT ferroelectric thin film in which ferroelectric properties such as relative dielectric constant are improved can be formed by doping a high concentration of Nb without co-doping silicon or the like.

The PNbZT ferroelectric thin film obtained using the method according to the embodiment has extremely superior ferroelectric properties such as relative dielectric constant and thus can be desirably used as a constituent material for manufacturing a complex electronic component such as a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

EXAMPLES

Next, Examples of the invention and Comparative Examples will be described in detail.

Example 1-1

As the PZT ferroelectric thin film-forming composition for forming the crystallization promoting layer, a PZT sol-gel solution (trade name: PZT-E1, manufactured by Mitsubishi Material Corporation) was prepared in which a metal composition ratio (Pb/Zr/Ti) was 115/53/47, and the concentration of the precursor (total concentration of a Pb source, a Zr source, and a Ti source) diluted with 1-butanol as a solvent was adjusted to 12 wt % in terms of oxides. As the composition for forming the PNbZT ferroelectric thin film, a PNbZT sol-gel solution (trade name: PNbZT-E1, manufactured by Mitsubishi Material Corporation) was prepared in which a metal composition ratio (Pb/Nb/Zr/Ti) was 115/8/47.8/44.2, and the concentration of the precursor (total concentration of a Pb source, a Nb source, a Zr source, and a Ti source) diluted with 1-butanol as a solvent was adjusted to 15 wt % in terms of oxides. That is, in this composition, 8 at % of Nb was contained in 100 at % of all the B site atoms (Zr, Ti).

First, the prepared PZT sol-gel solution was dripped on a Pt film (lower electrode) having crystals preferentially oriented to [111] of a Pt/$TiO_x$/$SiO_2$/Si substrate, followed by spin-coating at a rotating speed of 3000 rpm for 15 seconds.

As a result, a coating film (gel film) was formed on the lower electrode. Next, the coating film formed on the substrate was pre-baked using a hot plate by being held in the air at a temperature of 300° C. for 5 minutes. The coating process of the composition to the pre-baking process were repeated three times. Next, the pre-baked coating film was baked by RTA by being heated in an oxygen atmosphere from room temperature to 700° C. at a temperature increase rate of 10° C./sec and was held at this temperature for 1 minute. As a result, a crystallization promoting layer which was formed of a PZT ferroelectric thin film having a thickness and crystal orientation as shown in Table 1 was formed.

First, the prepared PNbZT sol-gel solution was dripped on the formed crystallization promoting layer, followed by spin-coating at a rotating speed of 3000 rpm for 15 seconds. As a result, a coating film (gel film) of PNbZT was formed on the crystallization promoting layer. Next, the coating film formed on the crystallization promoting layer was pre-baked using a hot plate by being held in the air at a temperature of 300° C. for 5 minutes. The coating process of the composition to the pre-baking process were repeated three times. Next, the pre-baked coating film was baked by RTA by being heated in an oxygen atmosphere from room temperature to 700° C. at a temperature increase rate of 10° C./sec and was held at this temperature for 1 minute. As a result, a PNbZt ferroelectric thin film was formed on the lower electrode.

Examples 1-2 and 1-3 and Comparative Examples 1-1 to 1-3

Each of PNbZT ferroelectric thin films was formed on the lower electrode with the same method as that of Example 1-1, except that the coating amount of the PZT sol-gel solution was adjusted such that the thickness of the crystallization promoting layer was as shown in Table 1 below. In Comparative Example 1-1, the coating amount of the PZT sol-gel solution was 0, that is, the crystallization promoting layer was not formed, the PNbZT sol-gel solution was directly coated on the lower electrode, followed by pre-baking and baking under the same conditions as those of Example 1-1, to form a PNbZT ferroelectric thin film.

Examples 2-1 and 2-2 and Comparative Examples 2-1 and 2-2

Each of PNbZT ferroelectric thin films was formed on the lower electrode with the same method as that of Example 1-1, except that the amount of Nb added to the crystallization promoting layer was changed as shown in Table 1 below by changing the composition during the preparation of the PNbZT sol-gel solution.

Comparative Test and Evaluation

Regarding each of the PNbZT ferroelectric thin films formed in Examples 1-1 to 2-2 and Comparative Examples 1-1 to 2-2, the thicknesses of the crystallization promoting layer and the PNbZT ferroelectric thin film, the crystal orientations of the lower electrode and the crystallization promoting layer, the film structure (whether or not cracking occurred) of the PNbZT ferroelectric thin film, the electrical properties (relative dielectric constant), and the leakage current density were evaluated. The results are shown in Table 1 below.

(1) Thickness: The thickness (total thickness) of a cross-section of the crystallization promoting layer before forming the PNbZT ferroelectric thin film was measured using a spectroscopic ellipsometer (M-2000DI, manufactured by J. A. Woollam Co. Inc.). In addition, the thickness of a cross-section of the formed PNbZT ferroelectric thin film was measured using the same device.

Figure 3:
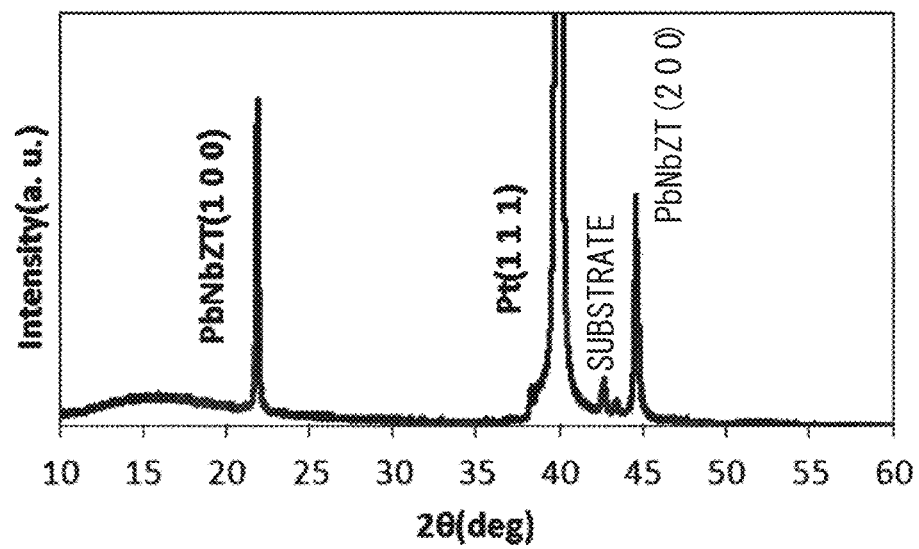
FIG. 3 is a diagram illustrating an XRD pattern of Example 1-1.

(2) Preferentially oriented plane: An orientation plane having the highest intensity among diffraction results obtained by the measurement using an X-ray diffractometer (XRD: MXP18HF, manufactured by Bruker Japan Co., Ltd.) was set as a preferentially oriented plane. FIG. 3 is a representative diagram illustrating an XRD pattern of Example 1-1.

(3) Relative dielectric constant: The measurement was performed using a ferroelectric tester (TF-Analyzer 2000, manufactured by aixACCT Systems GmbH). Specifically, an electrode having a size of 200 μmφ was formed on a surface of the formed PNbZT ferroelectric thin film using a sputtering method, and damage recovery annealing was performed by RTA in an oxygen atmosphere at a temperature of 700° C. for 1 minute, thereby obtaining a thin film capacitor as a measurement sample. The relative dielectric constant of this thin film capacitor was measured.

(4) Leakage current density: A DC voltage of 5V was applied to the film of which the relative dielectric constant was measured to measure the leakage current density.

Figure 4:
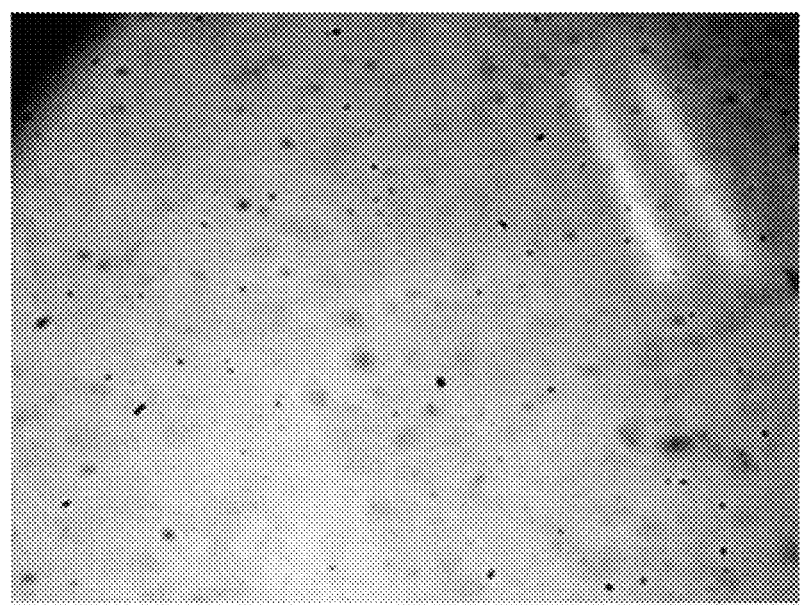
FIG. 4 is an image obtained when a surface of a PNbNZT ferroelectric thin film obtained in Example 1-1 is observed with a scanning electron microscope (SEM).
Figure 5:
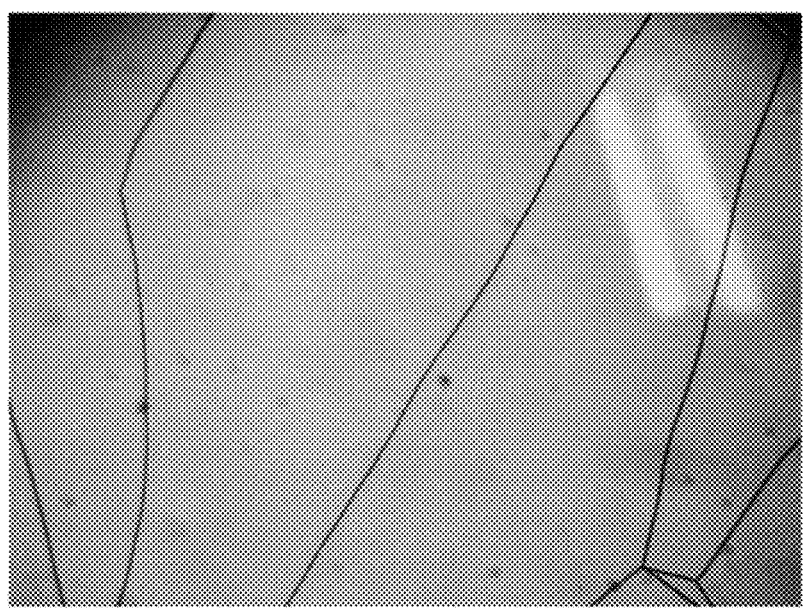
FIG. 5 is an image obtained when a surface of a PNbNZT ferroelectric thin film obtained in Comparative Example 2-2 is observed with an SEM.

(5) Film structure: An SEM image of the structure of the film surface was observed using the scanning electron microscope used in the thickness measurement. In addition, whether or not cracking occurred was determined based on the SEM image. FIGS. 4 and 5 are representative diagrams illustrating the images of the film surfaces of Example 1-1 and Comparative Example 2-2 observed at this time.

was low, the effects corresponding to the doping amount of Nb were not sufficiently obtained. On the other hand, in Examples 1-1 to 1-3 in which the desired crystallization promoting layer was formed to form the PNbZT ferroelectric thin film, the effects of high-concentration Nb doping were sufficiently obtained, and the relative dielectric constant values were able to be significantly improved.

In addition, when Examples 2-1 and 2-2 were compared to Comparative Examples 2-1 and 2-2, the following results were obtained. In Comparative Example 2-1 in which the ratio of Nb to 100 at % of all the B site atoms (Zr, Ti) was lower than 4 at %, the relative dielectric constant was improved to some extent but was not sufficient as compared to Examples 2-1 and 2-2. In addition, since the amount of Nb added was small, the leakage current density was slightly higher than those of Examples 2-1 and 2-2. In addition, in Comparative Example 2-2 in which the ratio of Nb to 100 at % of all the B site atoms (Zr, Ti) was higher than 10 at %, the relative dielectric constant was relatively high; however, since cracking occurred in the formed PNbZT ferroelectric thin film, the leakage current density was significantly high. On the other hand, in Examples 2-1 and 2-2 in which the concentration of Nb was high and the ratio of Nb was controlled to the desired ratio, cracking did not occur the effects of high-concentration Nb doping were sufficiently obtained, and the relatively dielectric constant values were able to be significantly improved.

TABLE 1

| | Pt Lower Electrode | Crystallization Promoting Layer | | PNbZT Ferroelectric Thin Film | | Relative Dielectric Constant | Leakage Current Density $(A \cdot cm^{-2})$ | Cracking |
|---|---|---|---|---|---|---|---|---|
| | Preferentially Oriented Plane | Thickness (nm) | Preferentially Oriented Plane | Pb/Nb/Zr/Ti (Atomic Ratio) | Thickness (nm) | | | |
| Comp. Ex. 1-1 | (111) | — | — | 115/8/47.8/44.2 | 240 | 1020 | $1 \times 10^{-8}$ | None |
| Comp. Ex. 1-2 | (111) | 40 | Random | 115/8/47.8/44.2 | 280 | 1100 | $1 \times 10^{-8}$ | None |
| Ex. 1-2 | (111) | 45 | (100) | 115/8/47.8/44.2 | 285 | 2100 | $1 \times 10^{-8}$ | None |
| Ex. 1-1 | (111) | 60 | (100) | 115/8/47.8/44.2 | 300 | 2200 | $1 \times 10^{-8}$ | None |
| Ex. 1-3 | (111) | 90 | (100) | 115/8/47.8/44.2 | 330 | 1950 | $1 \times 10^{-8}$ | None |
| Comp. Ex. 1-3 | (111) | 100 | (100) | 115/8/47.8/44.2 | 340 | 1600 | $1 \times 10^{-8}$ | None |
| Comp. Ex. 2-1 | (111) | 60 | (100) | 115/3/50.4/46.6 | 300 | 1650 | $1.3 \times 10^{-8}$ | None |
| Ex. 2-1 | (111) | 60 | (100) | 115/4/49.9/46.1 | 300 | 1920 | $1 \times 10^{-8}$ | None |
| Ex. 2-2 | (111) | 60 | (100) | 115/10/46.8/43.2 | 300 | 2230 | $1 \times 10^{-8}$ | None |
| Comp. Ex. 2-2 | (111) | 60 | (100) | 115/15/44.2/40.8 | 300 | 1780 | $7.2 \times 10^{-8}$ | Occurred |

As clearly seen from Table 1, when Examples 1-1 to 1-3 were compared to Comparative Examples 1-1 to 1-3, the following results were obtained. In Comparative Example 1-1 in which the PNbZT ferroelectric thin film was formed without forming the crystallization promoting layer, the relative dielectric constant was significantly lower than those of Examples 1-1 to 1-3 in spite that a high-concentration of Nb was doped. In addition, in Comparative Example 1-2 in which the thickness of the formed crystallization promoting layer was less than 45 nm, the crystallization promoting layer was randomly oriented (non-orientation) in an island shape, and the relative dielectric constant values of the PNbZT ferroelectric thin film were significantly lower than those of Examples 1-1 to 1-3. In addition, in Comparative Example 1-3 in which the thickness of the formed crystallization promoting layer was greater than 90 nm, the relative dielectric constant was improved to some extent; however, since the ratio of PNbZT in the entire film While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

INDUSTRIAL APPLICABILITY

The present invention can be desirably used for manufacturing a complex electronic component such as a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

What is claimed is:

1. A method of forming a niobium-doped lead zirconate titanate (PNbZT) ferroelectric thin film used for a capacitor, the method comprising:
   coating a composition for forming a ferroelectric thin film, which is formed of a lead zirconate titanate (PZT)-based composite perovskite film not containing Nb, on a Pt lower electrode formed on a substrate and preferentially oriented to [111], pre-baking the composition, and baking the composition to be crystallized and to thereby form a crystallization promoting layer having a thickness of 45 to 90 nm on the lower electrode;
   coating a composition for forming a ferroelectric thin film, which is formed of a PNbZT-based composite perovskite film containing 4 to 10 at % of Nb in 100 at % of all the B site atoms (Zr, Ti), on the formed crystallization promoting layer to form a coating film of PNbZT on the crystallization promoting layer; and
   pre-baking the coating film and then baking the coating film to be crystallized and to thereby form a PNbZT ferroelectric thin film with a thickness of 285 nm to 330 nm on the lower electrode; and wherein
   the formed PNbZT ferroelectric thin film has a relative dielectric constant of 1920 to 2230.

2. The method of forming a niobium-doped lead zirconate titanate (PNbZT) ferroelectric thin film according to claim 1, wherein the composition coated on the formed crystallization promoting layer contains 4 to 8 at % of Nb in 100 at % of all the B site atoms (Zr, Ti).

3. A complex electronic component comprising:
   a PNbZT ferroelectric thin film which is formed using the method according to claim 1,
   wherein the complex electronic component is a thin film capacitor, a capacitor, an IPD, a DRAM memory capacitor, a laminated capacitor, a gate insulator of a transistor, a non-volatile memory, or an LC noise filter element.

* * * * *